United States Patent [19]
Sato

[11] Patent Number: 5,326,404
[45] Date of Patent: Jul. 5, 1994

[54] PLASMA PROCESSING APPARATUS

[75] Inventor: Junichi Sato, Tokyo, Japan

[73] Assignee: Sony Corporation, Tokyo, Japan

[21] Appl. No.: 992,978

[22] Filed: Dec. 18, 1992

[30] Foreign Application Priority Data

Dec. 19, 1991 [JP] Japan .................. 3-353998

[51] Int. Cl.$^5$ .................. C23C 16/48
[52] U.S. Cl. .................. 118/723 MR; 118/724
[58] Field of Search .................. 118/723, 724, 723 MR

[56] References Cited

U.S. PATENT DOCUMENTS

| | | | |
|---|---|---|---|
| 4,223,048 | 9/1980 | Engle | 118/723 |
| 4,592,306 | 6/1986 | Gallego | 118/723 |

FOREIGN PATENT DOCUMENTS

| | | | |
|---|---|---|---|
| 59-16329 | 1/1984 | Japan | 118/723 |
| 60-63920 | 4/1985 | Japan | 118/723 |
| 60-101934 | 6/1985 | Japan | 118/723 |
| 61-288077 | 12/1986 | Japan | 118/724 |
| 62-50469 | 3/1987 | Japan | 118/724 |
| 63-28871 | 2/1988 | Japan | 118/724 |
| 63-270469 | 11/1988 | Japan | 118/723 |
| 2-39422 | 2/1990 | Japan | 118/725 |
| 4-26769 | 1/1992 | Japan | 118/723 |

*Primary Examiner*—Richard Bueker
*Attorney, Agent, or Firm*—Hill Steadman & Simpson

[57] ABSTRACT

A plasma processing apparatus for processing a semiconductor wafer by using a plasma to fabricate a semiconductor device comprises: a film forming vessel having at least one film forming chamber for forming a Ti/TiN laminate layer or a Ti/TiON/TiN laminate layer on a semiconductor wafer therein; and a heating system for heating the side wall of the film forming vessel so that the inner surface of the side wall is heated at a predetermined temperature to prevent the deposition of a coarse TiN film or TiN particles, which are liable to deteriorate the quality of the laminate layer formed on the semiconductor wafer, over the inner surface of the side wall of the film forming vessel.

3 Claims, 4 Drawing Sheets

F I G. 2A
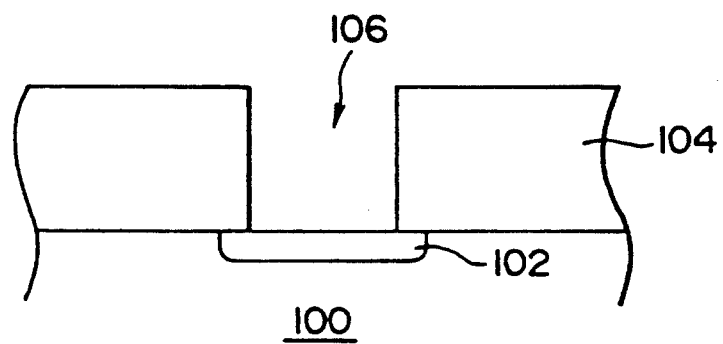
F I G. 2B
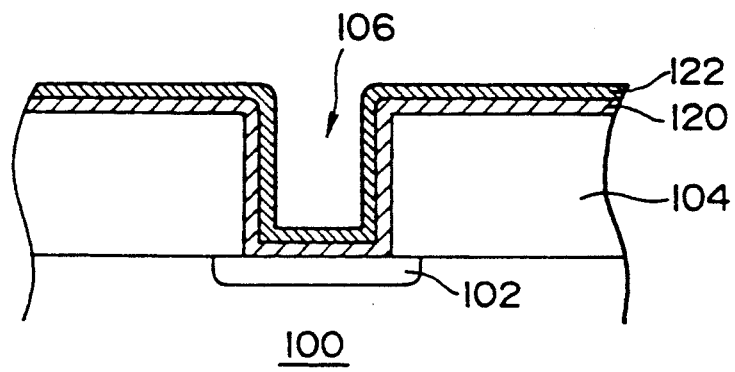
F I G. 2C
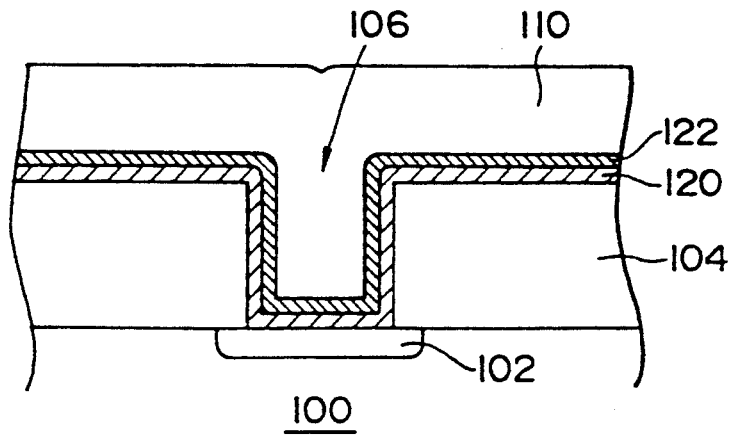

PLASMA PROCESSING APPARATUS

BACKGROUND OF THE INVENTION

1. Field of the Invention

The present invention relates to a plasma processing apparatus and, more specifically, to a plasma processing apparatus suitable for forming a metal film, such as a TiN film, for an electronic device, such as a semiconductor device.

2. Description of the related Art

Electronic devices, such as semiconductor devices, have progressively been miniaturized. The size of contact holes has progressively been reduced with the miniaturization of semiconductor integrated circuits and the conventional thin film forming techniques, for example, the bias sputtering process for forming aluminum thin films, have become unable to cope with the progressive miniaturization of semiconductor integrated circuits. Accordingly, the blanket tungsten chemical vapor deposition process (hereinafter referred to as "blanket tungsten CVD process"), which is capable of forming films that have a high coverage, has become attractive in recent years.

Referring to FIG. 4, the blanket tungsten CVD process forms a layer insulating layer 104 over the surface of a silicon wafer 100 provided with a diffused layer 102, forms an opening 106 through the layer insulating layer 104, forms a contact layer 108 of TiN or TiON over the surface of the layer insulating layer 104 and in the opening 106, forms a tungsten layer 110 over the contact layer, and then removes the tungsten layer 110 by etching, leaving only a portion of the tungsten layer 110 formed in the opening 106 to complete a contact hole. Since the adhesion of the tungsten layer 110 to the silicon wafer 100 is not very high, it is essential to form the contact layer 108 of TiN or the like between the silicon wafer 100 and the tungsten layer 110. If the contact layer 108 is unable to cover the inner surface of the opening 106 satisfactorily, it is possible that a void 112 is formed in a portion of the tungsten layer 110 deposited by a CVD process in the opening 106 formed in the layer insulating layer 104.

Since $TiCl_4$ is used as a source material for forming the contact layer 108 of TiN by a CVD process, the contact layer 108 is liable to contain Cl. Refer to, for example, "Photo Assisted LP-CVD TiN for Deep Submicron Contact Using Organotitanium Compound", Koichi Ikeda. et al., 1990 Symposium on VLSI Technology, pp. 61–62 for the further details. To avoid such a problem, an electron cyclotron resonance plasma CVD process (hereinafter referred to as "ECR plasma CVD process") for forming a TiN film is proposed in Akabori et al., "Ouyou Butsuri Gakkai Yokou-shu, Spring, 1990" 29a-ZA-6, p. 591. It is reported in this paper that the ECR plasma CVD process was able to form a TiN film in a high coverage and the Cl content of the TiN film was reduced when the TiN film was formed at a temperature on the order of 650° C.

It is known that the mode of growth of TiN crystals is dependent on temperature, that is, a coarse TiN film is formed when TiN crystals grow at a relatively low temperature and, in an extreme case, TiN particles are formed Refer to Kagaku Kogakkai, "CVD Handbook", pp. 578, 583, Asakura Shoten K.K., Jun. 20, 1991.

When forming a TiN film on a wafer by a blanket tungsten CVD process, the wafer is placed in a film forming chamber and is heated at a temperature on the order of 650° C. Although a TiN film of good quality is formed over the surface of the wafer, a coarse TiN film is formed over the inner surface of the walls of the film forming chamber and, in an extreme case, TiN particles are formed because the walls of the film forming chamber are not heated, which reduces the yield of the semiconductor device manufacturing process. Accordingly, the development of an ECR plasma CVD apparatus capable of forming TiN film or the like without producing particles has been desired.

SUMMARY OF THE INVENTION

Accordingly, it is an object of the present invention to provide a plasma processing apparatus capable of avoiding forming particles and of manufacturing semiconductor devices at a high yield.

In one aspect of the present invention, a plasma processing apparatus for processing a semiconductor wafer by a plasma comprises a film forming vessel defining a film forming chamber, and a heating system for heating the walls of the film forming vessel. Preferably, the plasma is produced by electron cyclotron resonance (ECR).

Preferably, the film forming vessel has a plurality of chargers for forming a Ti/TiN layer or a Ti/TiON/TiN layer, and the heating system is provided with a heating element buried in the walls of the film forming vessel. Since the walls defining the film forming chambers is heated by the heating system, a TiN film of good quality is formed over the inner surface of the walls of the film forming vessel and no particles are formed on the inner surface of the walls. Thus, the plasma processing apparatus of the present invention is capable of manufacturing semiconductor devices at a high yield.

BRIEF DESCRIPTION OF THE DRAWINGS

The above and other objects, features and advantages of the present invention will become more apparent from the following description taken in connection with the accompanying drawings, in which:

FIGS. 2A, 2B and 2C are schematic, fragmentary sectional views of assistance in explaining steps of a blanket tungsten CVD process of fabricating a semiconductor device by the plasma processing apparatus of FIG. 1;

DESCRIPTION OF THE PREFERRED EMBODIMENTS

First Embodiment

Figure 1:
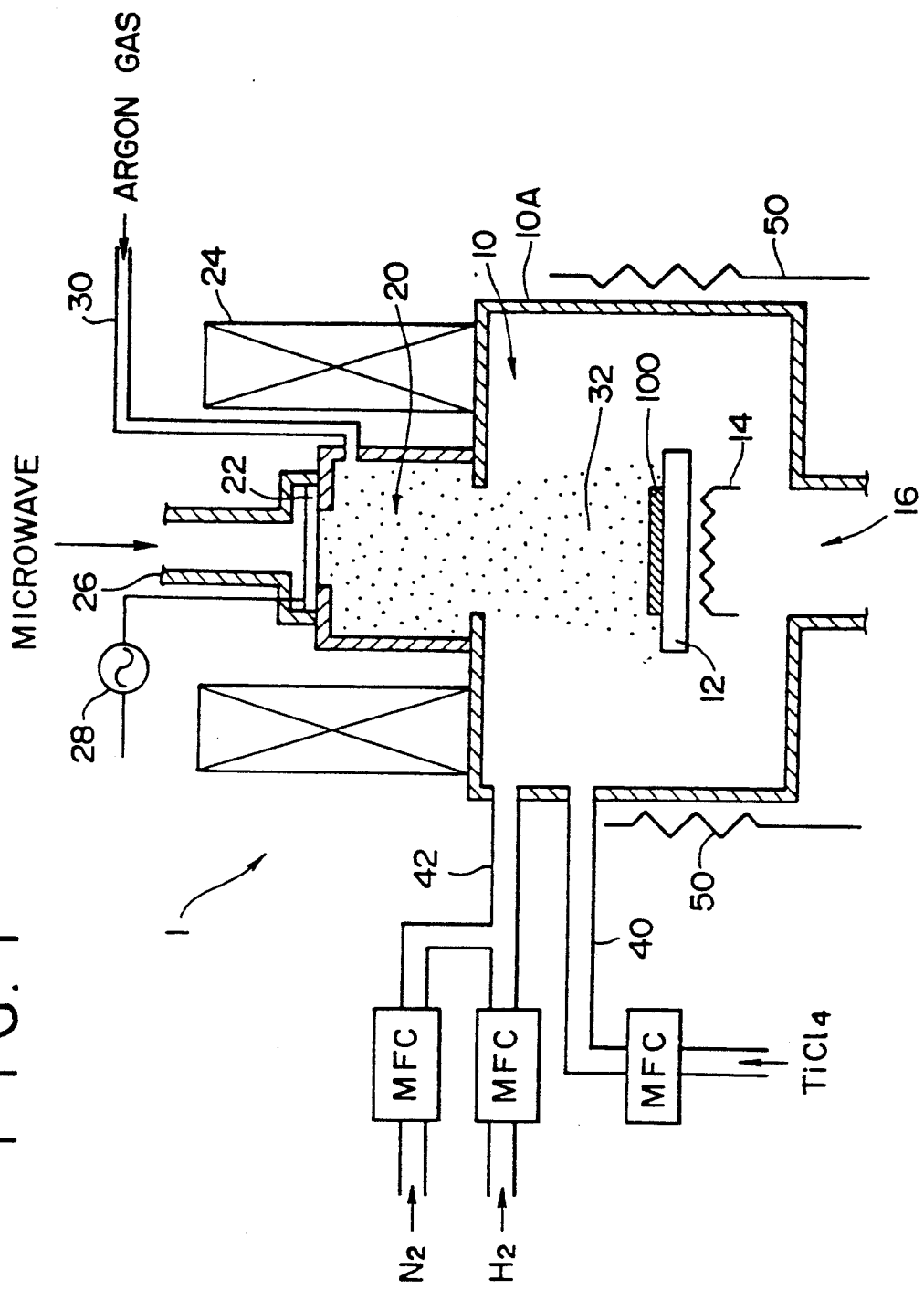
FIG. 1 is a schematic view, partly in section, of a plasma processing apparatus in a first embodiment according to the present invention.

As shown in FIG. 1, a plasma processing apparatus 1 in a first embodiment according to the present invention for carrying out a blanket tungsten CVD process to fabricate a semiconductor integrated circuit is an ECR plasma CVD apparatus. This plasma processing apparatus 1 forms a contact layer of Ti and a barrier layer of TiN successively on a semiconductor wafer 100.

The plasma processing apparatus 1 has a film forming vessel having a film forming chamber 10 and a plasma chamber 20. A susceptor 12 is disposed within the film forming chamber 10, and a heating element 14 for heating a semiconductor wafer 100 placed on the susceptor 12 is buried in the susceptor 12. The plasma chamber 20 is formed on and connected with the film forming chamber 10. A microwave inlet window 22 is formed in the upper wall of the plasma chamber 20, and a rectangular waveguide 26 for guiding the propagation of microwaves of 2.45 MHz is connected to the microwave inlet window 22. The plasma chamber 20 is surrounded by a coil 24. An RF power source 28 supplies RF power to the microwave inlet window 22. Argon gas is supplied through an argon gas inlet 30 into the plasma chamber 20 to keep the microwave inlet window 22 clean. This technique is described in Akabori et al., Spring, 1989, Ouyou Butsuri Gakkai Yokou-shu, 3P-2F-1, p. 721.

A TiCl$_4$ gas source supplies TiCl$_4$ gas through a mass flow controller MFC and a first gas supply line 40 into the film forming chamber 10, and N$_2$ gas and H$_2$ gas are supplied through mass flow controllers MFCs and a second gas supply line 42 into the film forming chamber 10. The gases are discharged from the film forming chamber 10 through a discharge duct 16.

A heating system 50, which is the feature of the present invention, has heating element buried in the side walls 10A of the film forming chamber 10 to heat the film forming chamber 10. The heating system 50 and the heating element 14 for heating the semiconductor wafer 100 are controlled by a common temperature controller, not shown, so that the side walls 10A and the semiconductor wafer 100 are heated, respectively, at desired temperatures. In FIG. 1, indicated at 32 is a plasma.

A process of forming a Ti layer and a TiN layer over the surface of the semiconductor wafer 100, such as a silicon wafer, by the plasma processing apparatus 1 will be described hereinafter with reference to FIGS. 2A, 2B and 2C.

Referring to FIG. 2A, a layer insulating layer 104 of SiO$_2$ or the like is formed on the semiconductor wafer 100 previously provided with a diffused layer 102, and then an opening 106 is formed in the layer insulating layer 104 by a known lithographic process and a known dry etching process to obtain a workpiece as shown in FIG. 2A.

Then, TiCl$_4$ gas and H$_2$ gas are supplied, respectively, through the first gas supply line 40 and the second gas supply line 42 into the film forming chamber 10 to form a Ti layer 120 of 30 nm in thickness over the surface of the layer insulating layer 104 and over the side wall of the opening 106 under the following conditions.

Gas supply rate: TiCl$_4$/Ar/H$_2$ = 10/50/50 (sccm)
Temperature: About 400° C.
Pressure: 0.13 Pa
Microwave power: 2,8 kW Subsequently, TiCl$_4$ gas is applied through the first gas supply line 40 and N$_2$ gas and H$_2$ gas are supplied through the second gas supply line 42 into the film forming chamber 10 to form a TiN layer 122 of 50 nm in thickness over the Ti layer 120 under the following conditions to complete a contact layer and a barrier layer.

Temperature: About 650° C.
Microwave power: 2.8 kW
Pressure: 0.13 Pa
RF bias power: 300 W Gas supply rate: TiCl$_4$/N$_2$/H$_2$/Ar = 10/30/30/50 (sccm)

The ratio between the flow rates of the gases may be selectively determined. Preferably, the ratio between the flow rate of TiCl$_4$ gas and that of N$_2$+H$_2$ is in the range of 1:1 to 2. The RF bias improves the coverage, compactness and barrier effect of the TiN layer 122.

The heating performance of the heating element 14 is controlled to maintain the temperature of the susceptor 12 at 400° C. and the heating system 50 is controlled to maintain the temperature of the side wall 10A of the film forming chamber 10 at 400° C. The side wall 10A of the film forming chamber 10 must be heated at a temperature suitable for forming a TiN layer of good quality, for example, a temperature in the range of 400° C. to 700° C. A TiN layer of good quality is not of neither a coarse TiN film nor an aggregate of TiN particles.

Since the internal pressure of the film forming chamber 10 when forming the TiN layer 122 is relatively low, the TiN layer 122 is formed in a sufficiently large thickness over the bottom surface of the opening 106 as shown in FIG. 2B. Since Cl reacts with H$_2$ to produce highly volatile HCl and HCl is discharged through the discharge duct 16, the respective Cl contents of the Ti layer 120 and the TiN layer 122 are small. Since the Ti layer 120 and the TiN layer 122 are formed continuously without breaking the vacuum, the plasma processing apparatus is able to form films of good quality stably at a high productivity.

Then, a tungsten layer 110 is formed over the TiN layer 122 under the following conditions.

First Step
  Gas supply rate: WF$_6$/SiH$_4$ = 25/10 (sccm)
  Pressure: 1.06×10$^4$ Pa
  Temperature: 475° C.
Second Step
  Gas supply rate: WF$_6$/H$_2$ = 60/360 (sccm)
  Pressure: 1.06×10$^4$ Pa
  Temperature: 475° C.

Thus the tungsten layer 110 having satisfactory coverage is formed as shown in FIG. 2C. Since the Ti layer 120 and the TiN layer 122 do not overhang the opening 106 and have satisfactory coverage, no void is formed in a portion of the tungsten layer 110 in the opening 106. The Ti layer 120 and the TiN layer 122 formed in the opening 106 serve as satisfactory barrier layers.

When processing semiconductor wafers by the prior art plasma processing apparatus, TiN particles are formed on the inner surface of the walls of the film forming chamber as the number of processing cycles increases and the TiN particles come off the inner surface of the walls and fall on the semiconductor wafer to reduce the yield of the plasma processing apparatus. It was confirmed through experimental operation of the plasma processing apparatus of the present invention that no TiN particle was formed on the inner surface of the side walls 10A of the film forming chamber 10 after 300 semiconductor wafers have been processed.

Second Embodiment

Figure 3:
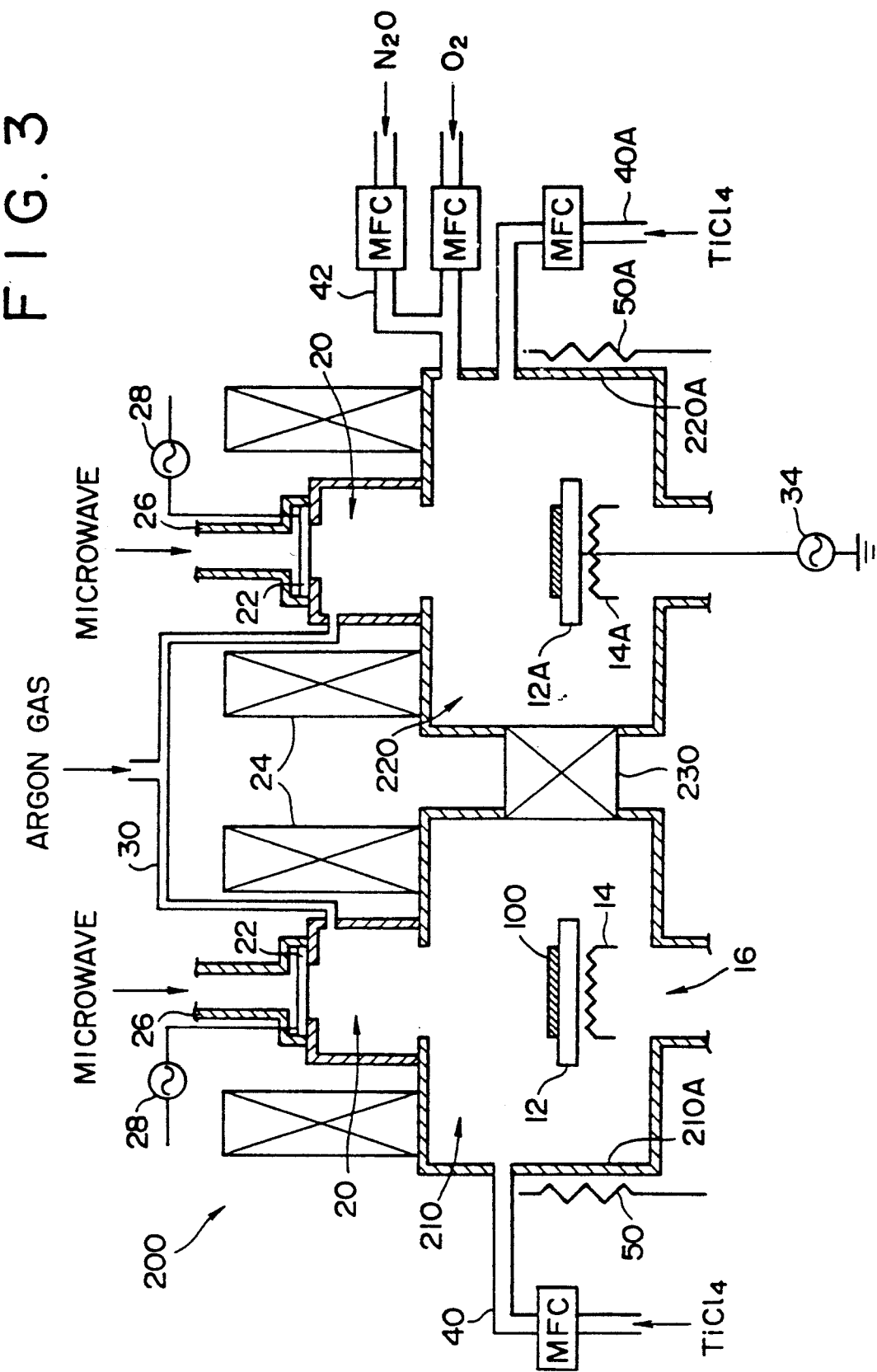
FIG. 3 is a schematic view, partly in section, of a plasma processing apparatus in a second embodiment according to the present invention.
Figure 4:
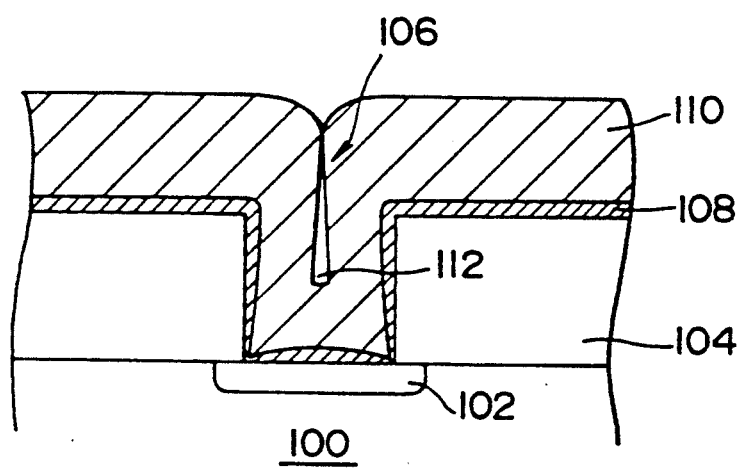
FIG. 4 is a schematic, fragmentary sectional view of assistance in explaining problems in a blanket tungsten CVD process of fabricating a semiconductor device using a prior art electron cyclotron resonance (ECR) plasma CVD apparatus.

A plasma processing apparatus 200 in a second embodiment according to the present invention is shown in FIG. 3, in which parts like or corresponding to those shown in FIG. 1 are denoted by the same reference characters. The plasma processing apparatus 200 has two film forming chambers, a first film forming chamber 210 and a second film forming chamber 220, connected by a gate valve 230. A Ti layer is formed in the first film forming chamber 210, and a TiON layer (titanium acid nitride layer) and a TiN layer (titanium nitride layer) are formed in the second film forming chamber 220. TiCl$_4$ gas is supplied from a TiCl$_4$ source through a mass flow controller MFC and a first gas supply line 40 to the first film forming chamber 210. TiCl$_4$ gas is supplied from a TiCl$_4$ source through a mass flow controller MFC and a first gas supply line 40A to the second film forming chamber 220, and N$_2$O gas and O$_2$ gas are supplied through mass flow controllers MFCs and a second gas supply line 42 to the second film forming chamber 220.

Heating systems 50 and 50A, which are the features of the present invention, have heating elements buried in the respective side walls 210A and 220A of the first film forming chamber 210 and the second film forming chamber 220 to heat the first film forming chamber 210 and the second film forming chamber 220, respectively. Heating elements 14 and 14A are buried in susceptors 12 and 12A to heat semiconductor wafers placed on the susceptors 12 and 12A, respectively. The heating systems 50 and 50A and the heating elements 14 and 14A are controlled by a common temperature controller, not shown.

A process of forming a Ti layer in the first film forming chamber 210 on a semiconductor wafer, such as a silicon wafer, and forming a TiON layer and a TiN layer on Ti layer in the second film forming chamber 220 by the plasma processing apparatus 200 will be described hereinafter.

A work as shown in FIG. 2A is placed on the susceptor 12 in the first film forming chamber 210 and a Ti layer of 30 nm in thickness is formed under the following conditions.

Gas supply rate: TiCl$_4$/Ar/H$_2$ = 10/50/50 (sccm)
Temperature: About 400° C.
Pressure: 0.13 Pa
Microwave power: 2.8 kW After the Ti layer has been formed, the gate valve 230 is opened, the semiconductor wafer 100 is transferred from the first film forming chamber 210 through the gate valve 230 onto the susceptor 12A in the second film forming chamber 220 by a conveyor, not shown, and then a TiN layer and a TiON layer are formed over the Ti layer. The TiON layer is formed under the following conditions.

Temperature: About 650° C.
Microwave power: 2.8 kW
Pressure: 0.13 Pa
RF bias: 300 W
Gas supply rate: TiCl$_4$/N$_2$/O$_2$/Ar = 10/40/20/50 (sccm)

The TiN layer is formed under the following conditions.

Temperature: About 650° C.
Microwave power: 2.8 kW
Pressure: 0/3 Pa
RF bias: 300 W
Gas supply rate: TiCl$_4$/N$_2$/H$_2$/Ar = 10/30/30/50 (sccm)

Then, a tungsten layer is formed over the TiN layer under the same conditions as those for forming the tungsten layer 110 by the plasma processing apparatus in the first embodiment. The tungsten layer may be formed under the following conditions.

Gas supply rate: WF$_6$/H$_2$ = 60/360 (sccm)
Pressure: $1.06 \times 10^4$ Pa
Temperature: 475° C.

Although the present invention has been described as applied to ECR plasma CVD apparatus, the present invention is applicable to an ECR plasma etching apparatus. The plasma processing apparatus of the present invention is applicable to carrying out a high-temperature aluminum sputtering process for aluminum refilling as well as to carrying out a blanket tungsten plug forming process. The plasma processing apparatus of the present invention is applicable to forming a TiB$_2$ film as well as to forming a TiN film, a TiON film and TiN film.

The heating system for heating the film forming chamber and the heating element buried in the susceptor may individually be controlled by separate controllers. The heating system may be provided with a heating element buried in the upper wall or bottom wall of the film forming chamber in addition to the heating element buried in the side wall of the film forming chamber. The heating system may be provided with heating lamps arranged around the film forming chamber instead of the heating element. The heating system may employ heating lamps or a liquid heating medium instead of the heating element.

As is apparent from the foregoing description, the plasma processing apparatus of the present invention has the film forming vessel having a side wall heated by a heating means and defining a film forming chamber to form, for example, a Ti layer and a TiN layer therein. Since the side wall of the film forming vessel is heated at a temperature at which no TiN particle is not formed, significant deposition of TiN particles over the inner surface of the side wall of the film forming vessel will not occur even after a relatively large number of film forming cycles are performed. Accordingly, the plasma processing apparatus need not be cleaned frequently, which reduces maintenance work for cleaning the plasma processing apparatus and enables the plasma processing apparatus to operate at a high productivity, a high efficiency and a high yield to fabricate reliable electronic devices.

Although the invention has been described in its preferred forms with a certain degree of particularity, obviously many changes and variations are possible therein. It is therefore to be understood that the present invention may be practiced other wise than as specifically described herein without departing from the scope and spirit thereof.

What is claimed is:

1. A plasma processing apparatus for processing semiconductor wafers, comprising:
   a electron cyclotron resonance plasma generating apparatus including a plasma chamber in which plasma is generated during processing;
   a wafer processing chamber in fluid communication with said plasma chamber to receive the plasma during the processing;
   a wafer supporting platform in said wafer processing chamber on which said semiconductor wafers are mounted for the processing;
   a first heater mounted in thermal communication with said wafer supporting platform and controllable to heat the semiconductor wafers during the processing;
   a second heater mounted in thermal communication with said wafer processing chamber to heat walls of said wafer processing chamber during the processing; and means for charging said wafer processing chamber with gases for the processing.

2. A plasma processing apparatus as claimed in claim 1, wherein said second heater is buried in said walls of said wafer processing chamber.

3. A plasma processing apparatus as claimed in claim 1, wherein said first heater and said second heater heat said wafer supporting platform to a same temperature as said plasma processing chamber during the process.

* * * * *